(12) United States Patent
Xue et al.

(10) Patent No.: US 9,250,293 B2
(45) Date of Patent: Feb. 2, 2016

(54) CAPACITIVE TEST DEVICE AND METHOD FOR CAPACITIVE TESTING A COMPONENT

(75) Inventors: Ming Xue, Singapore (SG); Weng Yew Kok, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 364 days.

(21) Appl. No.: 13/544,852

(22) Filed: Jul. 9, 2012

(65) Prior Publication Data
US 2014/0009181 A1   Jan. 9, 2014

(51) Int. Cl.
*G01R 31/28* (2006.01)
*G01R 31/312* (2006.01)
*G01R 1/07* (2006.01)

(52) U.S. Cl.
CPC ............ *G01R 31/312* (2013.01); *G01R 1/07* (2013.01); *G01R 31/2893* (2013.01)

(58) Field of Classification Search
CPC  G01F 23/266; G01R 31/312; G01R 27/2605; G01R 27/26; G01R 15/16; G01R 1/07; G01R 31/28; G01R 31/20
USPC ............ 324/756.02, 754.03, 763.01
See application file for complete search history.

(56) References Cited

U.S. PATENT DOCUMENTS

| | | | |
|---|---|---|---|
| 5,254,953 A | 10/1993 | Crook et al. | |
| 6,677,771 B2* | 1/2004 | Zhou et al. | 324/750.25 |
| 7,129,729 B2 | 10/2006 | Ho et al. | |
| 7,330,025 B1 | 2/2008 | Beach et al. | |
| 2002/0135356 A1* | 9/2002 | Ito et al. | 324/158.1 |
| 2007/0013383 A1 | 1/2007 | Parker et al. | |
| 2010/0148793 A1* | 6/2010 | Ito et al. | 324/537 |
| 2011/0050262 A1* | 3/2011 | Chen et al. | 324/754.27 |
| 2011/0148450 A1* | 6/2011 | Suto | 324/756.04 |

FOREIGN PATENT DOCUMENTS

EP   0633478 A2   1/1995

* cited by examiner

*Primary Examiner* — Son Le
(74) *Attorney, Agent, or Firm* — Slater & Matsil, L.L.P.

(57) ABSTRACT

A system and a method for capacitive testing a component (including a packaged component) are disclosed. An embodiment of a test head comprises a holding unit configured to pick-up, hold and release the component, an electrode configured to receive a capacitive signal from the component and a preamplifier configured to amplify the capacitive signal.

21 Claims, 7 Drawing Sheets

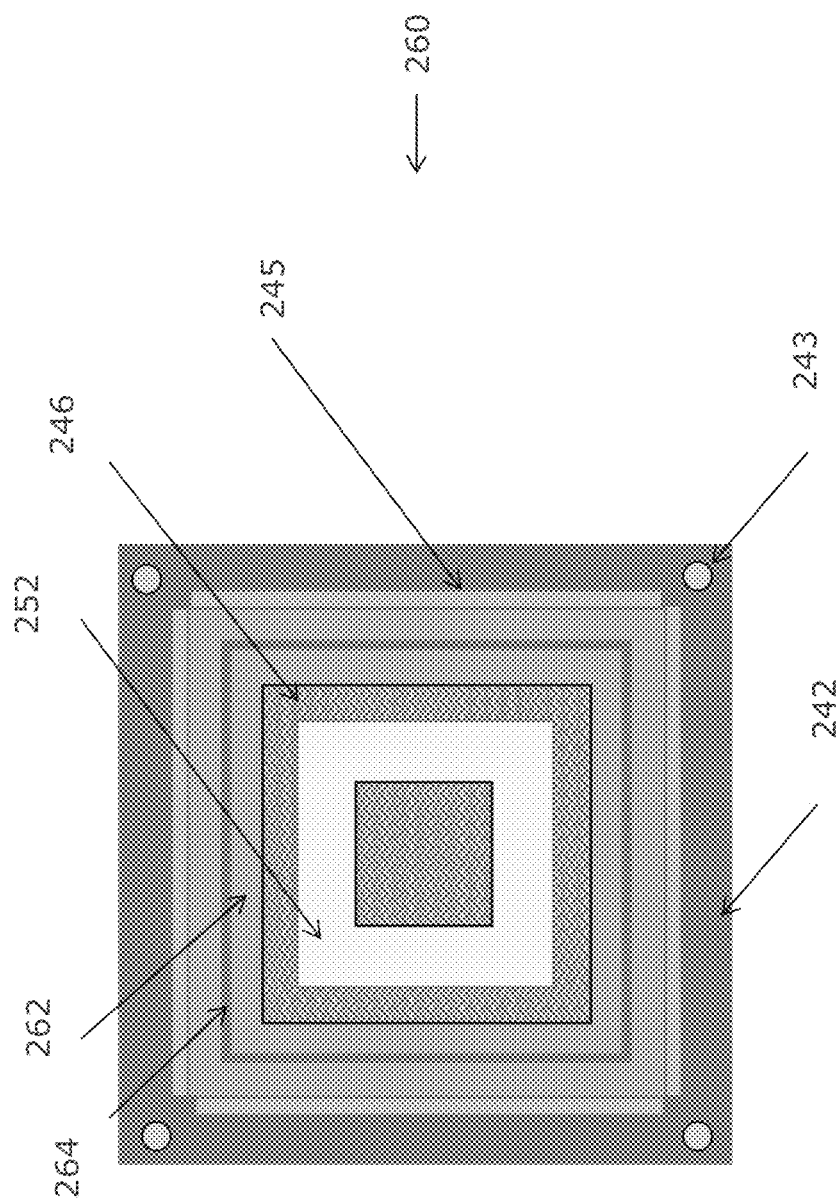

CAPACITIVE TEST DEVICE AND METHOD FOR CAPACITIVE TESTING A COMPONENT

TECHNICAL FIELD

The present invention relates generally to a system and method for capacitive testing of components, and, in particular embodiments, to a system and method for capacitive testing of semiconductor devices.

BACKGROUND

Conventional testing methods such as x-ray testing, automated test equipment (ATE) testing and vector less testing cannot detect or are insufficient in detecting interconnect defects such as neighboring wires being too close, neighboring leads being too close or sagging wires.

SUMMARY OF THE INVENTION

In accordance with an embodiment of the present invention, a test head for testing a component comprises a holding unit configured to pick-up, hold and release the component, an electrode configured to receive a capacitive signal from the component and a preamplifier configured to amplify the capacitive signal.

In accordance with an embodiment of the present invention, a test head for testing a component comprises a holding unit configured to be placed onto, clamp to and separated from the component, an electrode configured to receive a capacitive signal from the component, and a preamplifier configured to amplify the capacitive signal.

In accordance with an embodiment of the present invention, a system for testing a component comprises a test head configured to receive capacitive signals of a plurality of components, a test tray configured to be loaded with the plurality of components, and a loading board configured to load the plurality of components into the test tray. The system further comprising a pogo pin fixture configured to provide signals to the plurality of components and a controller configured to process the received capacitive signals.

In accordance with an embodiment of the present invention, a method for capacitive testing a component comprises (1) picking up the component with a test head from a tray, the tray comprising a plurality of component and (2) capacitive testing the component with the test head. The method further comprises (3) after capacitive testing, releasing the component onto the tray and (4) repeating (1)-(3) for remaining components of the plurality of components. In accordance with an embodiment of the present invention, a method for capacitive testing a component, the method comprises (1) placing the component in a DUT tray, (2) loading the DUT tray between a test board and a test head and (3) aligning the test head with the component. The method further comprises (4) capacitive testing the component with the test head, (5) after capacitive testing, separating the test head from the component, and (6) un-loading the DUT tray and removing the component from the DUT tray.

BRIEF DESCRIPTION OF THE DRAWINGS

For a more complete understanding of the present invention, and the advantages thereof, reference is now made to the following descriptions taken in conjunction with the accompanying drawings, in which:

FIG. 2b shows an embodiment of an integrated test head;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a system and method for capacitive testing of packaged semiconductor devices. The embodiments may also be applied, however, to a system and method for capacitive testing DUTs (e.g., components).

Embodiments of the invention provide an integrated test head or a precision test head for capacitive testing of DUTs (e.g., components). Embodiments of the invention provide an integrated test head comprising a holding or alignment unit and a capacitive testing unit. Further, embodiments of the invention provide a method for high volume capacitive testing of DUTs (e.g., components).

An advantage of the embodiments is a fast and reliable capacitive test method for components (packaged or unpackaged). A further advantage is that the through-put of the devices under test (DUTs) can be substantially increased compared to conventional methods.

Test systems and test methods for capacitive testing electrical connections in a component or between a component carrier (e.g., a leadframe) and a component are presented in embodiments of the invention. In other words, the integrity (e.g., wire sagging or swept) of the component or the electrical connection between a component carrier and a component are tested.

Figure 1A:
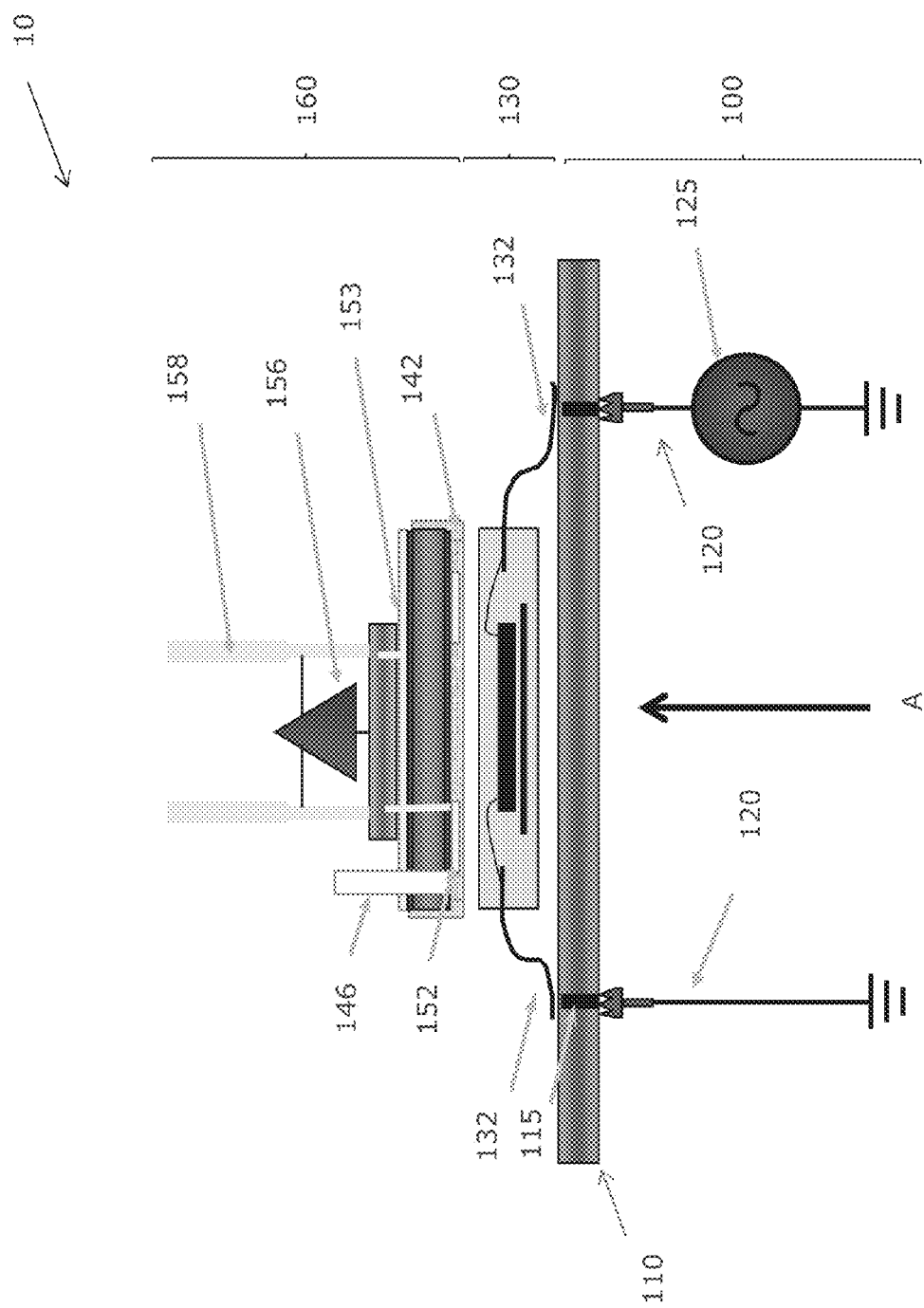
FIG. 1a shows an embodiment of a test system for capacitive testing of a component.

FIG. 1a shows a cross sectional view of a detail of a test system 10 comprising an integrated test head 160. The system 10 further comprises a test board or load board unit 100, the device under test (DUT) 130 and an integrated test head 160.

The integrated test head 160 comprises a holding unit and a testing unit. The holding unit is configured to hold the DUT 130 and the test unit is configured to test the DUT 130. The holding unit comprises a holding device 142 such as a suction cup. The holding device 142 is further configured to pick up and release the DUT 130. For example, the holding device 142 may further comprise a vacuum path 146. The vacuum path 146 is configured to provide a vacuum or an under pressure between the holding device 142 and the DUT 130.

The testing unit comprises a plate or a conductive electrode 152. The conductive electrode 152 together with the wiring in the DUT 130 provides the capacitive arrangement for the capacitive test. The testing unit further comprises a preamplifier 156 connected to a controller of the test system 10 via a data bus or a wiring system 158. The conductive electrode 152 is connected to a preamplifier 156. The preamplifier 156 is configured to amplify a signal received from a capacitive test on the DUT 130. The signal is transmitted from the preamplifier 156 to the controller via the wiring system 158. The controller calculates whether or not the DUT 130 is a good device or not.

The test board or load board unit 100 may comprise a board 110 having through holes 115. The test board unit 100 further comprises a connector 120 connected to an energy source 125 such as an AC source. The connector 120 may be pogo pins. The connector 120 is removably connected to DUT contacts or DUT pins 132 (e.g., leads) after the DUT 130 is placed on the board 110. The connector 120 establishes a temporary electrical connection between the DUT 130 and the energy source 125. For example, the pogo pins 120 are pressed to the DUT pins 132 and an AC voltage is applied to the DUT 130. For example, the DUT 130 comprises a 144 or 176 DUT pins 132.

The AC generator 125 may be an oscillator that supplies an alternating current signal to the DUT 130. When under test, the output of the AC generator 125 is connected via a first pogo pin 120 to a first DUT pin 132 of a plurality of DUT pins 132 and a ground (or some other voltage level) pin is connected to the one or more other DUT pins 132. The conductive electrode 152 is placed on top or on a top surface of the DUT 130. An insulator may be placed between the conductive electrode 152 and the DUT 130.

A voltage is applied to the DUT 130 and a current flows through the DUT pins 132. The DUT pins 132 may be tested one by one. At each DUT pin 132, a current is applied and through capacitive coupling, a current is passed to the conductive electrode 152. The current is amplified at the preamplifier 156. If the measured current for a DUT pin 132 is below a predetermined limit, the integrity of the DUT 130 (e.g., component or packaged component) is not warranted and the component or packaged component may not be discarded.

Figure 1B:
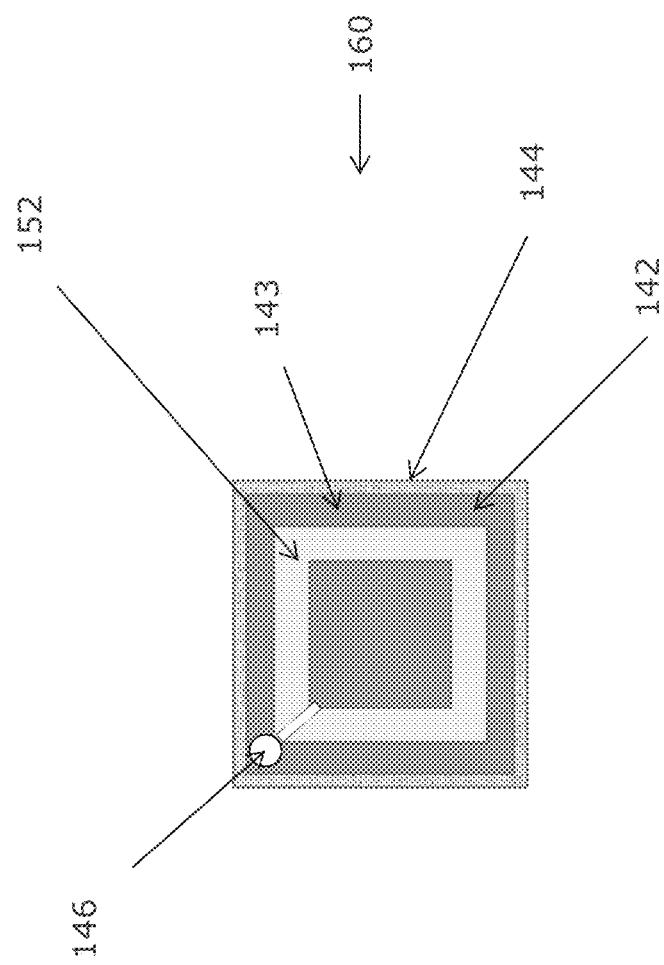
FIG. 1b shows an embodiment of an integrated test head.

FIG. 1b shows view of the integrated test head 160 along axis A. The test head comprises the holding device 142, the vacuum path 146 and the conductive electrode or plate 152. The holding device 142 comprises a first dielectric material or first insulating material 143 such as glass fiber. The holding device 142 further comprises a second dielectric material or second insulating material 144 such as rubber. The holding device 142 comprises the form of a cube, a block, a hemisphere, a cup or combinations thereof. Alternatively, the holding device comprises other geometrical forms.

The conductive electrode 152 may be a metal plate. The metal may be copper or copper alloy, or aluminum or aluminum alloy. Alternatively, the metal comprises other conductive materials. The conductive electrode 152 may be a ring plate such as a circular ring plate, a square ring plate, a rectangular ring plate, or combinations thereof. Alternatively, the conductive electrode 152 may comprise other geometrical forms.

Figure 2A:
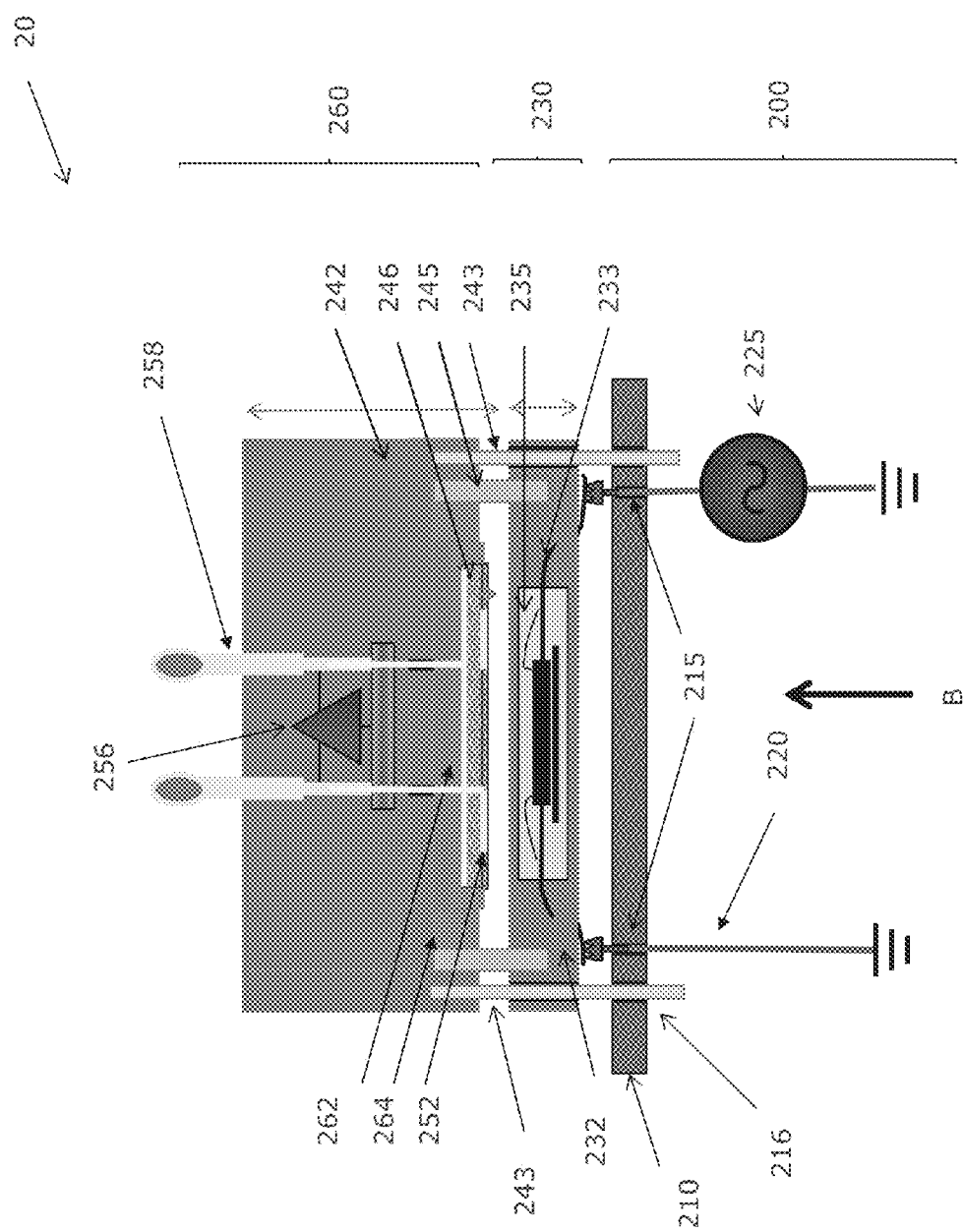
FIG. 2a shows an embodiment of a test system for capacitive testing of a component.

FIG. 2a shows a cross sectional view of a detail of a test system 20 comprising a precision test head 260. The test system 20 comprises a test board or load board unit 200, a device under test (DUT) tray 230 and a precision test head 260.

The precision test head 260 comprises a holding unit and a testing unit. The holding unit is configured to align with the DUT tray 230/DUT 235 and the test unit is configured to test the DUT 235. The holding unit comprises a mechanical fixture 242. The mechanical fixture 242 may comprise an x-y guide and a pin holder. The holding unit further comprises a guiding unit 243 configured to precisely guide the precision test head 260 onto the DUT tray 230 and/or the test board unit 200. The guiding unit 243 may be guiding pins.

The testing unit comprises a plate or a conductive electrode 252. The conductive electrode 252 together with the wiring in the DUT 235 provides the capacitive arrangement for the capacitive test. The testing unit further comprises a preamplifier 256 configured to be connected to a controller of the test system 20 via a data bus or a wiring system 258. The conductive electrode 252 is connected to a preamplifier 256. The preamplifier 256 is configured to amplify a signal received from a capacitive test on the DUT 235. The signal is transmitted from the preamplifier 256 to the controller via the wiring system 258. The controller calculates whether or not the DUT 235 is a good device or not.

The testing unit comprises a plate or conductive electrode 252. The conductive electrode 252 may be a metal plate comprising copper or copper alloy, or aluminum or aluminum alloy, for example. Alternatively, the metal comprises other conductive materials. The conductive electrode 252 may be a ring plate such as a circular ring plate, a square ring plate, a rectangular ring plate, or combinations thereof. Alternatively, the conductive electrode 252 may comprise other geometrical forms.

In one embodiment the conductive electrode 252 is disposed in a removable probe plate carrier 262 such as a ring probe plate carrier. The probe plate carrier 262 is directly fixed to the precision test head 260 via an interposer 264 or is directly fixed to the precision test head 260.

The DUT tray 230 comprise a DUT body guide 232 and guide pin holes to hold the DUT 235 and leads of DUT 235 are in precise position against the connectors 220. The DUT tray 230 may be an ABS, for example. Alternatively, the ABS could be other isolative materials. The DUT tray 230 is loaded with the DUTs 235 in a position outside its test position. The test position is a position of the DUT tray 235 between the precision test head 260 and the load board 210. For testing the DUT 235, the DUT tray 230 is moved back to the test position.

The test board or load board unit 200 may comprise a board 210 having first set of through holes 215 and second set of through holes 216. The first set of through holes 215 is configured to guide the connectors 220 and the second set of through holes 216 is configured to guide the guiding unit 243.

The test board unit 200 further comprises a set of connectors 220 connected to an energy source 225 such as an AC source one at a time. The connector 220 may be a pogo pins. The connector 220 is configured to establish an electrical connection to the DUT 235 in the DUT tray 230.

The connector 220 is removably connected to DUT contacts 233 of the DUT tray 230 after the test board 210 is moved to the DUT tray 230. The connector 220 establishes a temporary electrical connection between the DUT 235 inside the DUT tray 230 and the energy source 225. For example, under test the pogo pins 220 are pressed to the DUT contacts 233 (e.g., DUT pins) establishing a connection to the DUT 230. An AC voltage is applied to the DUT 235.

FIG. 2b shows view of the precision test head 260 along axis B. The precision test head 260 comprises the mechanical fixture 242 and the conductive electrode or plate 252. The mechanical fixture 242 comprises a plate carrier 262, a interposer 264, DUT leads guide 245 and precision placement guide 243, e.g. a guide pin. The plate carrier 262 comprises a conductive electrode 252 and a first insulating material 246 such as glass fiber.

The conductive electrode 252 is placed in the plate carrier 262. The plate carrier 262 comprises a second insulating material, such as taflon. The conductive electrode 252 comprises a metal such as copper or copper alloy, or aluminum or aluminum alloy. Alternatively, the metal comprises other conductive materials. The conductive electrode 252 may be a ring plate such as a circular ring plate, a square ring plate, a rectangular ring plate, or combinations thereof. Alternatively, the conductive electrode 252 may comprise other geometrical forms. In one embodiment the plate carrier 262 is spring loaded which holds the plate placement onto the DUT 235 surface without a gap to ensure the proper capacitive test condition.

The plate carrier guide 264 provides the precision placement guide for the plate carrier 262. In one embodiment the DUT leads guide 245 presses down the DUT pins 233 against the pogo pins 220.

Figure 2C:
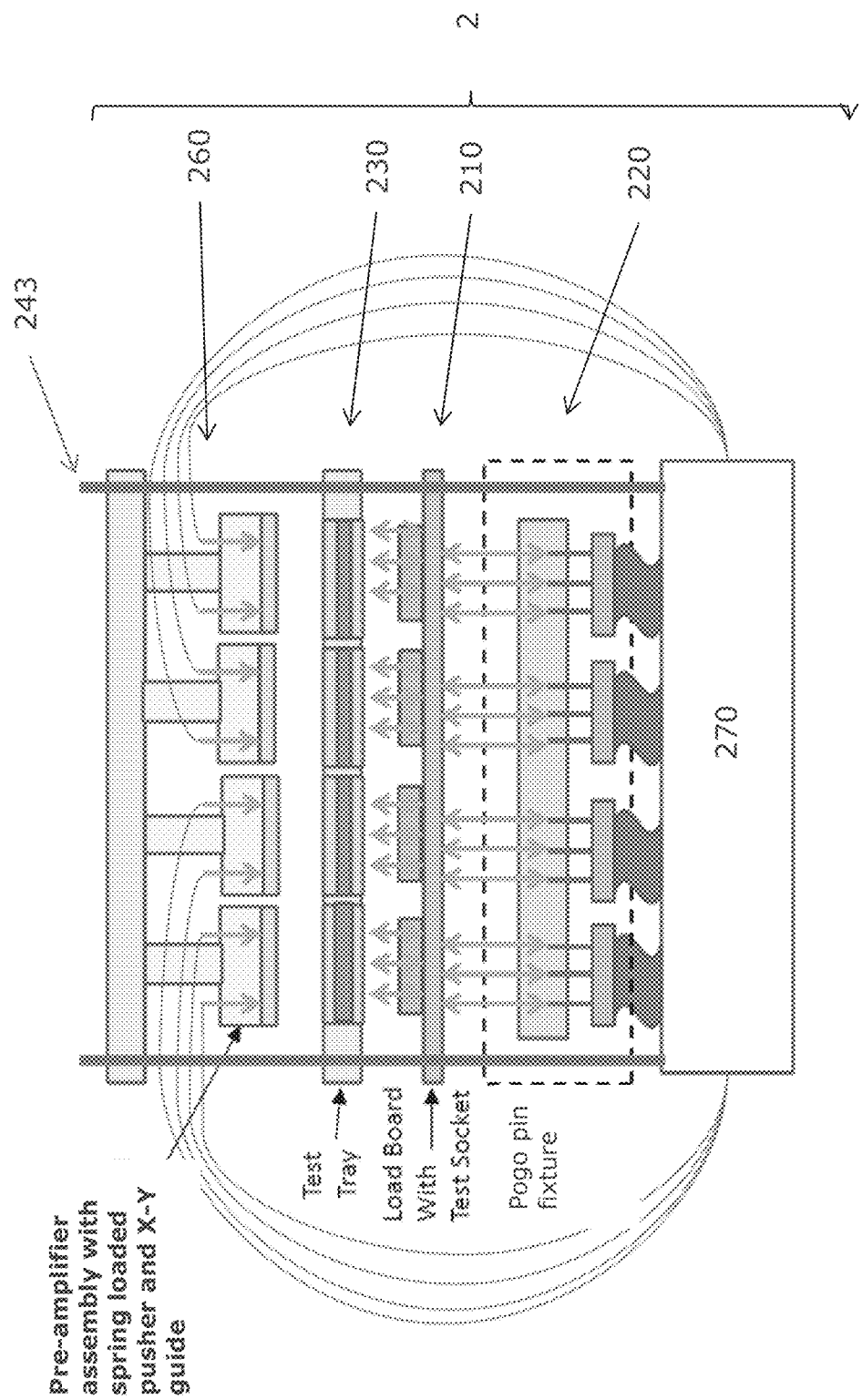
FIG. 2c shows an embodiment of a test system.

FIG. 2c shows an embodiment of a test system 2 comprising a precision test head 260. FIG. 2c shows a movable precision test head 260, a movable load board 210 and movable pogo pins 220. The embodiment of FIG. 2c shows four test heads 260, four DUTs in the DUT tray and four arrangements of pogo pins 220. Embodiments of the test system 2 may comprise a different number of test heads 260, etc.

The precision test head 260, the load board 210 and the pogo pins 220 are movable in a vertical direction. The precision test head 260 comprises a plurality of metal plates or conductive electrodes. As discussed above, the conductive electrodes may be a ring probe plate but may comprise other geometrical form. The precision test head 260 further comprises a plurality of spring loaded pushers (e.g., plate carrier 262) and a plurality of X-Y guides (e.g., plate carrier guide 264). The precision test head 260 is configured to measure capacitive signals applied via the connectors 220 to the DUTs in the DUT tray 230. Guide pins 243 provide the proper guidance and alignment for the loading board 210, the connectors 220 and the precision test head 260.

When the test tray 230 with the DUTs is positioned in the proper location in the test system 2 the load board 210 and the connectors 220 are moved to electrically connect the connectors 220 (e.g., pogo pins) with the tray contacts/DUT pins. The precision test head 260 is placed on the DUT tray 230 and a voltage and current is applied to the DUT pins one by one. The capacitive test signals are sensed by the conductive electrodes in the precision test heads. The test signals are transmitted to a preamplifier or a plurality of preamplifiers in the precision test head 260. The preamplifier amplifies the test signals and transmits them to the control unit 270 (e.g. capacitive test main frame) which processes, evaluates and/or calculates the received signals. In one embodiment, 144 pins of a QFP144 package are sequentially capacitive tested one by one. A first pogo pin may connected to the AC source and all other pogo pins are connected to ground for a first capacitive test. Then a second pogo pin may be connected to the AC source and all other pogo pins are connected to ground for a second capacitive test. This is repeated until all pins are tested.

Figure 3:
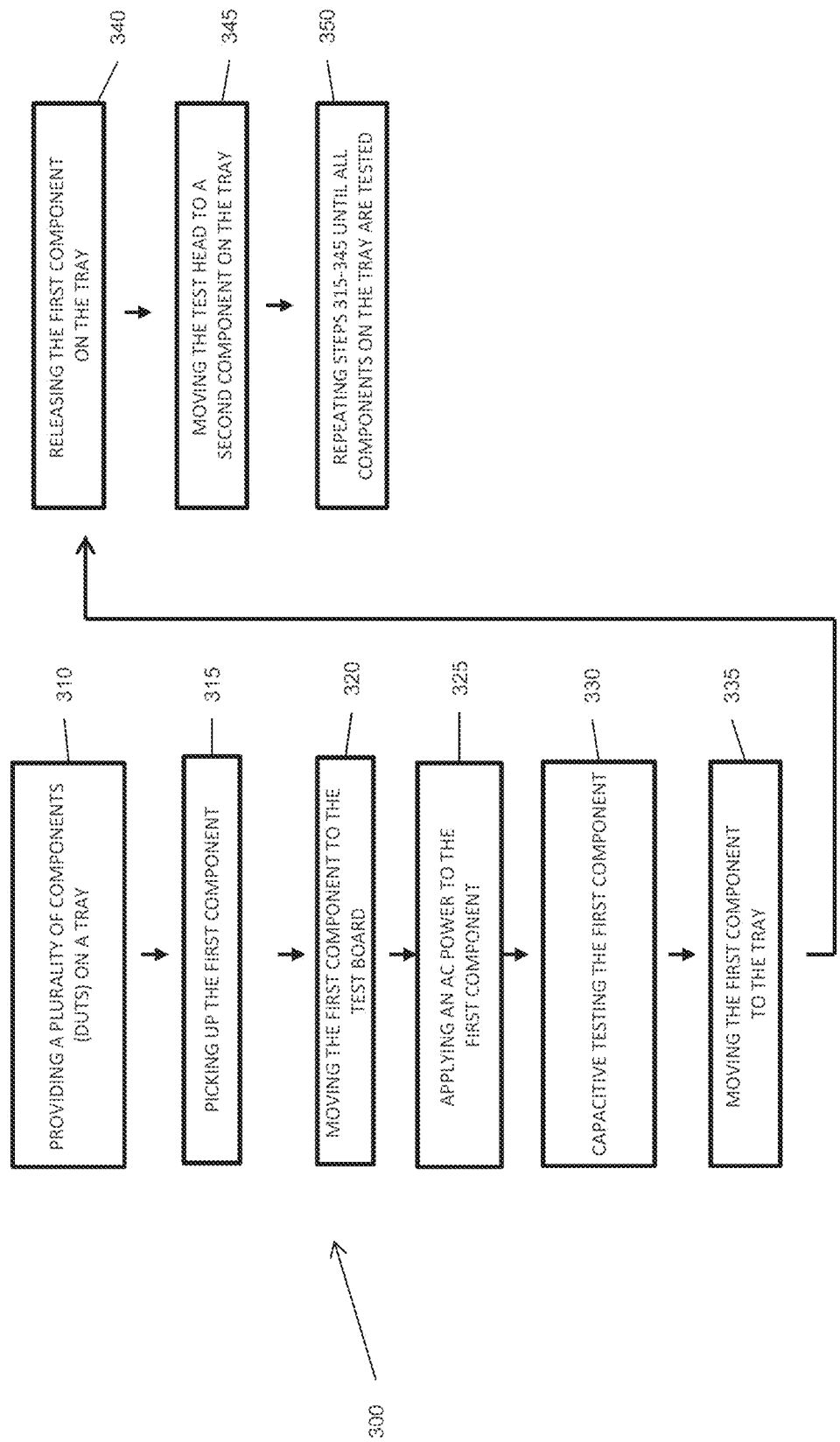
FIG. 3 shows an embodiment of a method for capacitive testing of a component.

FIG. 3 shows an embodiment of capacitive test method of a DUT 300 (e.g., component). In a first step 310 a plurality of components or devices under test (DUTs) are loaded on a tray. The component may be a semiconductor device such as a logic device, or a volatile or non-volatile memory device. The semiconductor device may be an integrated circuit (IC) or a single discrete device (stand-alone device). For example, the semiconductor device is a microcontroller, IGBT or a power MOSFET. Alternatively the component is a passive device such as a resistor, a capacitor, a MEMS device, an optoelectronic component, or a device of other functionality. The substrate of the component may be a semiconductive material such as silicon or germanium, a compound semiconductor such as SiGe, GaAs, InP, GaN or SiC, other inorganic materials, or organic materials such as glass or ceramics.

The component may be a packaged electric device comprising a chip or die placed on a leadframe, the chip being interconnected with the leadframe. The chip may comprise the same materials and functionalities as described with regard to the component. The chip is bonded to the leadframe with an electrical connection. The electrical connection (e.g., interconnect) may be a wire connection (wire bond) or a conductive clip connection. The chip is encapsulated with an encapsulation material providing a hermetic package. The encapsulation material may comprise a molding compound, a laminate or a casing. The encapsulation material may partially encapsulate the leadframe and completely encapsulate the chip. The encapsulation material may completely or partially encapsulate the wires and/or the conductive clips.

The encapsulation material may comprise thermosetting materials such as an epoxy, polyurethane or polyacryliate compound. Alternatively the encapsulation material may comprise thermoplastic materials such as polysulfones, polyphenylen sulfides, or polyetherimides. In one embodiment the encapsulation material may be a laminate such as a prepreg.

The leadframe may comprise a metal such as nickel (Ni), copper (Cu) or a combination thereof. In one embodiment the component is not a printed circuit board (PCB) or is not disposed on a printed circuit board (PCB).

In step 315, the integrated test head picks up a first component from the tray. In a first embodiment the integrated test head (e.g., the rubber suction cup) is placed on a first component. A low pressure (e.g., lower than the atmospheric pressure) or a vacuum is generated or applied between the first component and the integrated test head so that the first component is held or clamped to the integrated test head. The low pressure or vacuum is generated through the vacuum path. For example, a pressure between about 1 Pa to about 3 Pa is applied (1 Pascal=1 $N/m^2$).

In step 320, the first component is moved to and placed onto a test board or load board so that the component pins of the first component can be connected to a connector providing electrical energy.

In step 325, a power is applied to the first component. A connector such as pogo pins are moved towards and connected to the component pins of the first component via the test board one by one. A power (e.g., voltage and current) is applied to the first component. For example, an AC source is electrically connected to a first pin and then sequentially connected to other pins of the first component.

In step 330, the first component is capacitive tested. Applying the power (e.g., AC power) to the first pin of the first component generates a first capacitive signal which is received by the conductive electrode. After applying the power to the first pin, the power (e.g., AC power) is applied to the second pin of the first component generating a second capacitive signal which is received by the conductive electrode. Several or all pins of the first component are tested by applying the power.

The electrode measures the capacitive performance of the pins of the first component. The capacitive signals may depend on appropriate and proper wire connections and appropriate and proper lead placements of the first component. For example, if the wires are not properly connected (to a leadframe or to the chip, for example) the capacitive signal is different than if the wires are properly connected. Improper wire connections may generate a lower capacitive signal than proper wire connections. In one embodiment improper wire connections may generate a signal below a first predetermined value.

The capacitive signals are transmitted to a preamplifier and amplified. The pre-amplified signal is then transmitted to a controller which evaluates whether or not the capacitive signals are good signals, e.g., whether one or several of the capacitive signals are below a predetermined value.

After the capacitive test is completed the connectors including the AC source are moved away from the first component. Then, the first component is moved back and placed on the tray by the integrated test head (step 335). The first component is released from the integrated test head (step 340). In a first embodiment, the first component is released by turning off the vacuum or by equalizing the pressure in the integrated test head with the atmospheric pressure.

In step 345, the integrated test head is moved to a second component. In step 350 the steps 315-345 are repeated for the second component. For example, the integrated test head is placed on the second component, the second component is picked up and moved to the test board, a capacitive test is performed on the second component, and then the second component is moved back to the tray and released so that the integrated test head can move to the next component. This process is repeated until all components on the tray are capacitive tested. The capacitive test 300 is described for a single component. However, a skilled artisan understands that the capacitive test may be performed for two, three or more components in parallel. For example, the integrated head may be able to pick up and test two components at the same time.

Figure 4:
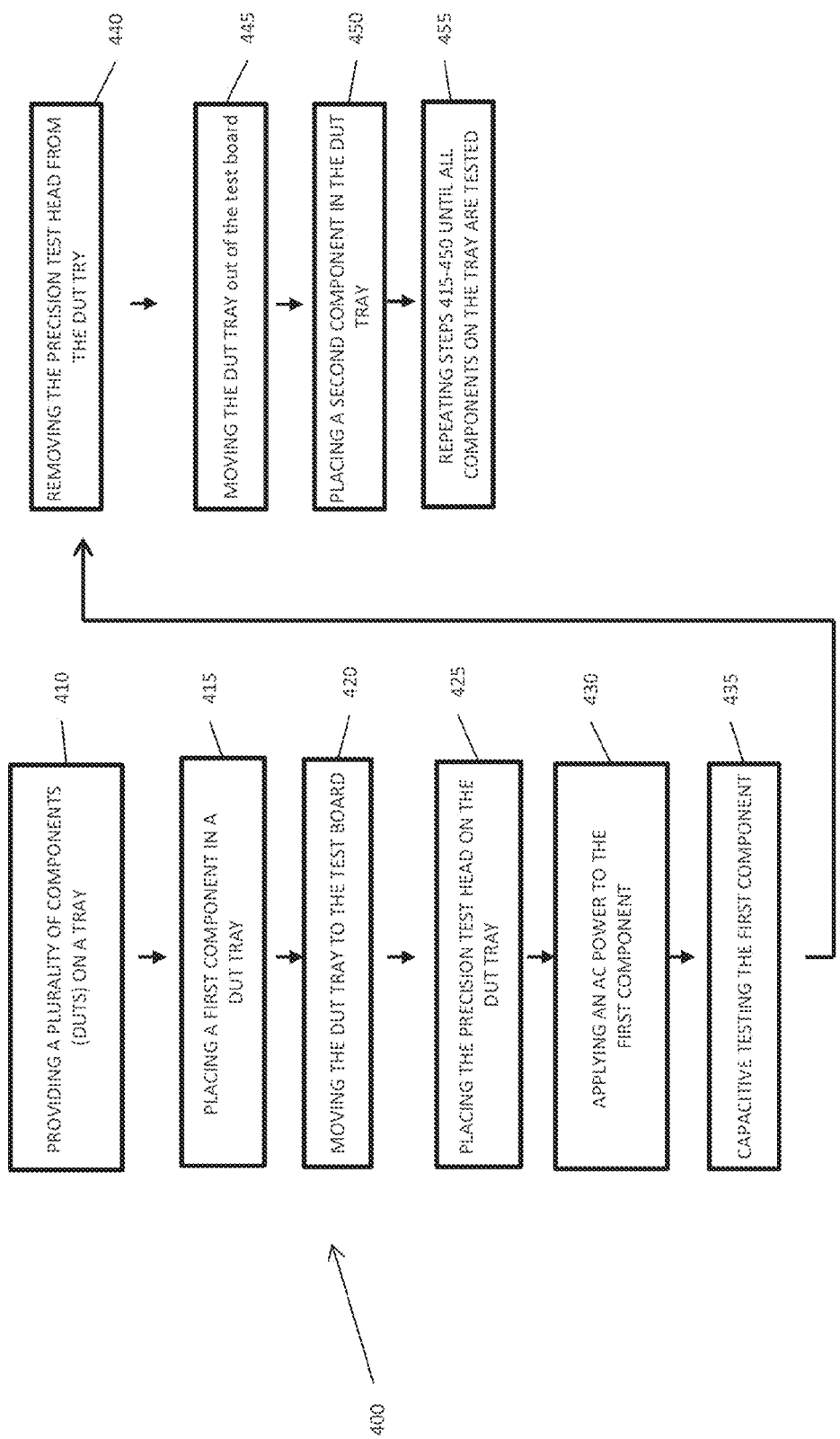
FIG. 4 shows an embodiment of a method for capacitive testing of a component.

FIG. 4 shows an embodiment of capacitive test method of a DUT 400. In a first step 410 a plurality of devices under test (DUTs) are loaded on a tray. The DUTs may be components (including packaged components) similar or the same as described with respect to FIG. 3.

In step 415, the first component is placed in a DUT tray. The first component is placed in a DUT tray by a pick & place machine. In one embodiment there a more than one first components placed in the DUT tray by a pick and place machine. In step 420 the DUT tray is moved or loaded to a position between the test board and the precision test head.

In step 425, the precision test head is vertically moved and placed on the DUT tray. In particular, the precision test head and the conductive electrode is moved down and aligned with the first component located in the DUT tray. The conductive electrode may be placed directly on the surface of the DUT. Moreover, the precision test head may, at the same time, place and adjust the DUT pins (e.g., leads) onto the connector (e.g., pogo pins) so that electrical energy can be provided.

In step 430, a power (voltage and current) is applied to the first component. The pogo pins connected to an energy source are electrically connected to the first component. For example, an AC source is electrically connected to a first pin of the first component. If the first component comprises a plurality of pins, the AC source is electrically connected the pins sequentially providing power to all pins (one by one) for performing the capacitive test.

In step 435, the first component is capacitive tested. Applying the power (e.g., AC power) to the first pin of the first component generates a first capacitive signal which is received by the conductive electrode of the precision test head. If a second pin to be tested applying the power (e.g., AC power) to the second pin of the first component generates a second capacitive signal which is received by the conductive electrode of the precision test head. The power is applied to all pins to be tested. The conductive electrode measures the capacitive performance of the pins. The capacitive signals may depend on appropriate and proper wire connections and appropriate and proper lead placements of the first component. If the wires are not properly connected (to a leadframe or to the chip, for example) the first capacitive signal is different than if the wires are properly connected. For example, improper wire connections may generate a lower first capacitive signal than proper wire connections. In one embodiment improper wire connections may generate a signal below a first predetermined value.

The first capacitive signals are transmitted to a preamplifier and amplified. The pre-amplified signal is then transmitted to a controller which evaluates whether or not the first capacitive signal is a good signal, e.g., whether the first capacitive signal is below a first predetermined value.

After the capacitive test is completed the connection (e.g., pogo pins) including the AC source and the precision test head are moved away from the first component of the DUT tray (step 440). Then the DUT tray including the first component is moved back and placed on the tray (step 445). The first component is removed from the DUT tray and a second component is placed into the DUT tray (step 450).

In step 455 the steps 415-450 are repeated for the second component. For example, the test head is placed on the second component, the second component is picked up and moved to the test board, a capacitive test is performed on the second component, and then the second component is moved back to the tray and released so that the test head can move to the next component. This process is repeated until all components on the tray are capacitive tested. The capacitive test 400 is described for a single component. However, a skilled artisan understands that the capacitive test may be performed for two, three or more components at the same time in parallel.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A test system for testing a component comprising:
   a test tray configured to be loaded with a plurality of components;
   a loading board configured to load the components into the test tray from underneath the test tray;
   a plurality of pin fixtures configured to move towards the test tray and to provide signals to the components;
   a plurality of test heads configured to move towards the test tray and to receive capacitive signals of the components, wherein the pin fixtures and the test heads move from opposite sides to the test tray; and
   a controller configured to process the received capacitive signals.

2. The test system according to claim 1, wherein the test heads comprise a plurality of ring probe electrodes and a plurality of preamplifiers.

3. The test system according to claim 2, wherein the test heads further comprise a plurality of x-y pushers and a plurality of x-y guides.

4. The test system according to claim 2, wherein the test heads further comprise a plurality of DUT body guides.

5. The test system according to claim 1, wherein the pin fixtures comprise a plurality of pogo pins.

6. The test system according to claim 5, wherein the pogo pins are electrically connected to a power source, and wherein the power source is configured to provide an AC current that generates the capacitive signals.

7. The test system according to claim 1, wherein the test heads comprise a plurality of guide pins, the guide pins being configured to align the test heads and the test tray.

8. The test system according to claim 1, wherein each component comprises a semiconductor device disposed on and bonded to a leadframe, the semiconductor device being encapsulated.

9. A test system for testing a component comprising:
- a test tray;
- a loading board configured to load a component into the test tray from underneath the test tray;
- a pin fixture configured to be connected to a bottom side of the component and to provide signals to the component;
- a test head configured to be connected to a top side of the component and to receive capacitive signals from the component; and
- a controller configured to process the received capacitive signals.

10. The test system according to claim 9, wherein the test head comprises a plurality of ring probe electrodes and a plurality of preamplifiers.

11. The test system according to claim 10, wherein the test head further comprises a plurality of x-y pushers and a plurality of x-y guides.

12. The test system according to claim 10, wherein the test head further comprises a DUT body guide.

13. The test system according to claim 9, wherein the pin fixture comprises a plurality of pogo pins.

14. The test system according to claim 13, wherein the pogo pins are electrically connected to a power source, and wherein the power source is configured to provide an AC current that generates the capacitive signals.

15. The test system according to claim 9, wherein the system further comprises guide pins configured to guide the test head, the test tray and the loading board.

16. The test system according to claim 9, wherein each component comprises a semiconductor device disposed on and bonded to a leadframe, the semiconductor device being encapsulated.

17. A test system for testing a packaged chip comprising:
- a test tray configured to provide a plurality of packaged chips;
- a loading board configured to load the plurality of packaged chips into the test tray from underneath the test tray;
- a pin fixture configured to provide signals to the plurality of packaged chips;
- a test head configured to receive capacitive signals from the plurality of packaged chips; and
- a controller configured to process the received capacitive signals, wherein the test head comprises a plurality of guide pins configured to guide the test head into the test tray.

18. The test system according to claim 17, wherein the test head further comprises a plurality of x-y pushers and a plurality of x-y guides.

19. The test system according to claim 18, wherein the test head further comprises a DUT body guide.

20. The test system according to claim 17, wherein the pin fixture comprises a plurality of pogo pins.

21. The test system according to claim 20, wherein the pogo pins are electrically connected to a power source, and wherein the power source is configured to provide an AC current that generates the capacitive signals.

* * * * *